(12) United States Patent
Takeuchi et al.

(10) Patent No.: US 6,288,529 B1
(45) Date of Patent: Sep. 11, 2001

(54) TIMING GENERATION CIRCUIT FOR AN ELECTRO-OPTIC OSCILLOSCOPE

(75) Inventors: Nobuaki Takeuchi; Yoshiki Yanagisawa; Jun Kikuchi; Nobukazu Banjou; Yoshio Endou; Mitsuru Shinagawa; Tadao Nagatsuma; Junzo Yamada, all of Tokyo (JP)

(73) Assignees: Ando Electric Co., LTD; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/323,942

(22) Filed: Jun. 2, 1999

(51) Int. Cl.[7] .......................... G01R 23/16; G01R 13/20; G01R 23/17; G01D 1/14
(52) U.S. Cl. .................................... 324/76.22; 324/76.25; 324/76.26; 324/76.36
(58) Field of Search ................................. 324/121 R, 96, 324/76.22, 76.25, 76.26, 76.27, 76.36; 315/364; 257/431; 359/189

(56) References Cited

U.S. PATENT DOCUMENTS

| | | | | |
|---|---|---|---|---|
| 4,219,762 | * | 8/1980 | Gilbert ................................. | 315/364 |
| 4,967,144 | * | 10/1990 | Aoshima et al. ....................... | 324/96 |
| 5,579,145 | * | 11/1996 | Bogdan et al. ........................ | 359/189 |
| 5,844,288 | * | 12/1998 | Mourou et al. ........................ | 257/431 |

FOREIGN PATENT DOCUMENTS

| | | |
|---|---|---|
| 0345011 A | 12/1989 | (EP) . |
| 04295028 | * 11/1992 | (JP) . |
| 5-40158 | 2/1993 | (JP) . |
| 5-47883 | 2/1993 | (JP) . |
| 5-72299 | 3/1993 | (JP) . |
| 5-80083 | 3/1993 | (JP) . |
| 5-240895 | 9/1993 | (JP) . |
| 6-94807 | 4/1994 | (JP) . |
| 7-55497 | 3/1995 | (JP) . |
| 7-55891 | 3/1995 | (JP) . |
| 8-43499 | 2/1996 | (JP) . |
| 8-152361 | 6/1996 | (JP) . |
| 8-160110 | 6/1996 | (JP) . |
| 8-262117 | 10/1996 | (JP) . |
| 9-159733 | 6/1997 | (JP) . |
| 9-197019 | 7/1997 | (JP) . |
| 9-211035 | 8/1997 | (JP) . |
| 09345572 | * 12/1997 | (JP) . |
| 11174090A | * 12/1997 | (JP) . |
| 11201994A | * 1/1998 | (JP) . |
| 11201995A | * 1/1998 | (JP) . |
| 11201996A | * 1/1998 | (JP) . |

OTHER PUBLICATIONS

Patent Abstracts of Japan, vol. 017, No. 415 (E–1407), Aug. 3, 1993 & JP 05 082606 A (Fujitsu Ltd), Apr. 2, 1993.

M. Shinagawa, et al., "A High–Impedance Probe Based on Electro–Optic Sampling", Proceedings of 15th Meeting on Lightwave Sensing Technology, LST 15–17, May, 1995.

* cited by examiner

*Primary Examiner*—Glenn W. Brown
*Assistant Examiner*—Wasseem H. Hamdan
(74) *Attorney, Agent, or Firm*—Burns Doane Swecker & Mathis LLP

(57) ABSTRACT

The present invention relates to an electro-optic sampling oscilloscope.

This electro-optic sampling oscilloscope carries out measurement of measured signal by using an optical pulse generated based on a timing signal generated from a timing generation circuit synchronous with a trigger signal, providing: a timing generation circuit comprising a fast ramp circuit that outputs a ramp waveform using said trigger signal as a trigger, a slow ramp circuit that increases stepwise and sequentially the output value according to said timing signal; a comparator circuit that compares the output of said fast ramp circuit and the output of said slow ramp circuit and outputs the results of this comparison; and a gate circuit that limits the output of said comparator circuit by closing a gate only when the output of said comparator circuit is unstable based on the input trigger signal and timing signal.

2 Claims, 5 Drawing Sheets

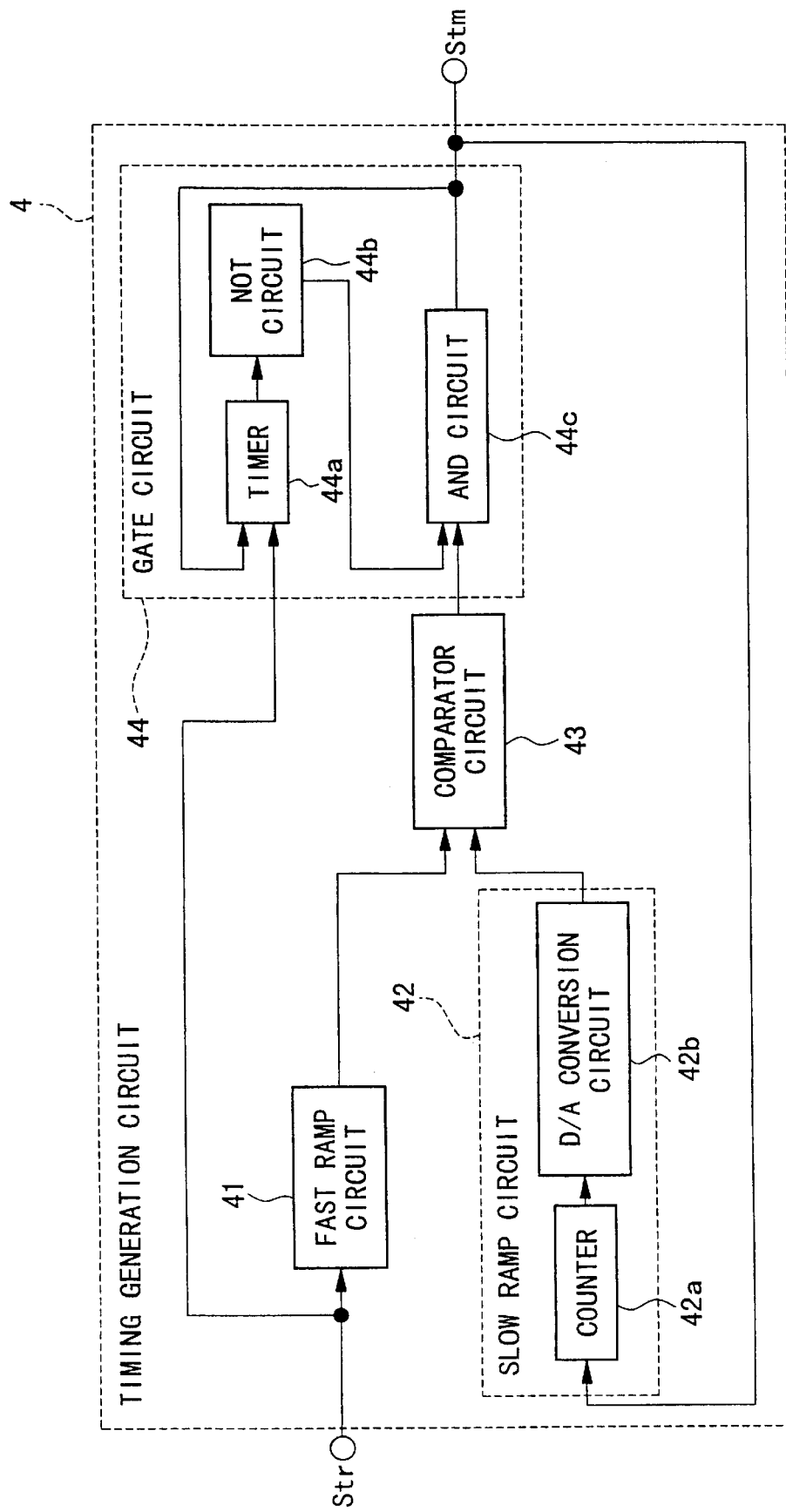
FIG._1

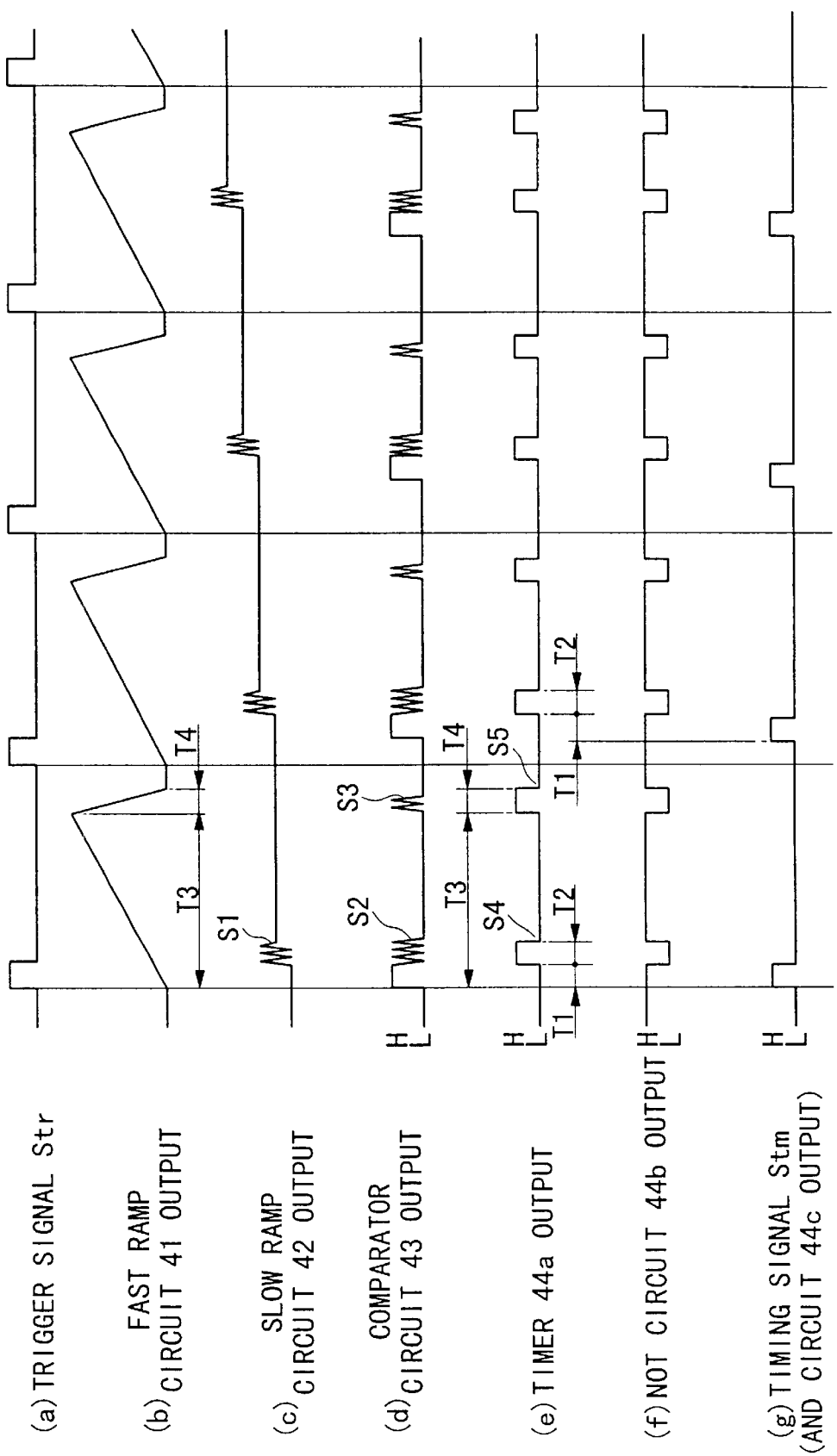
FIG._2

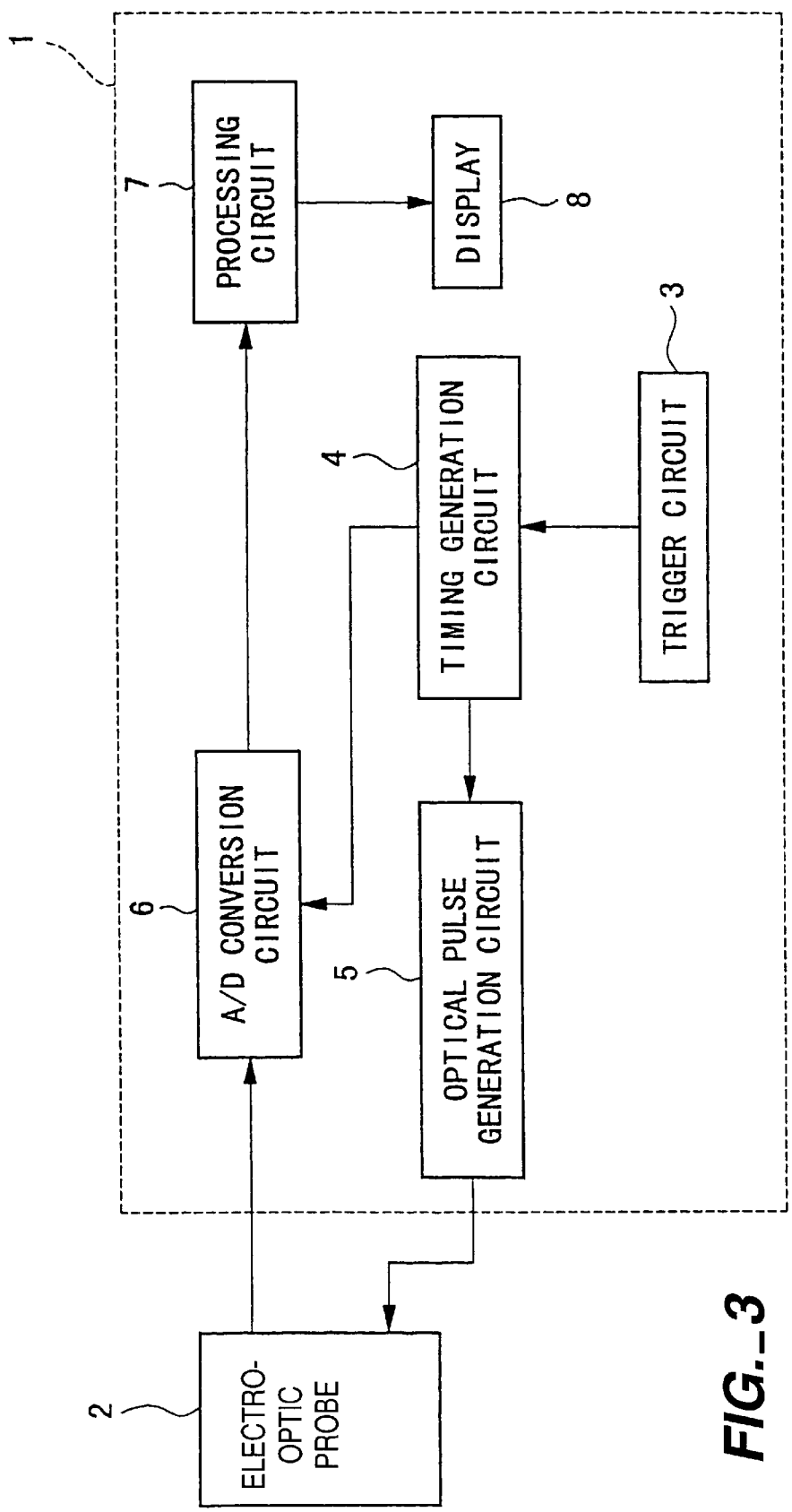
FIG._3

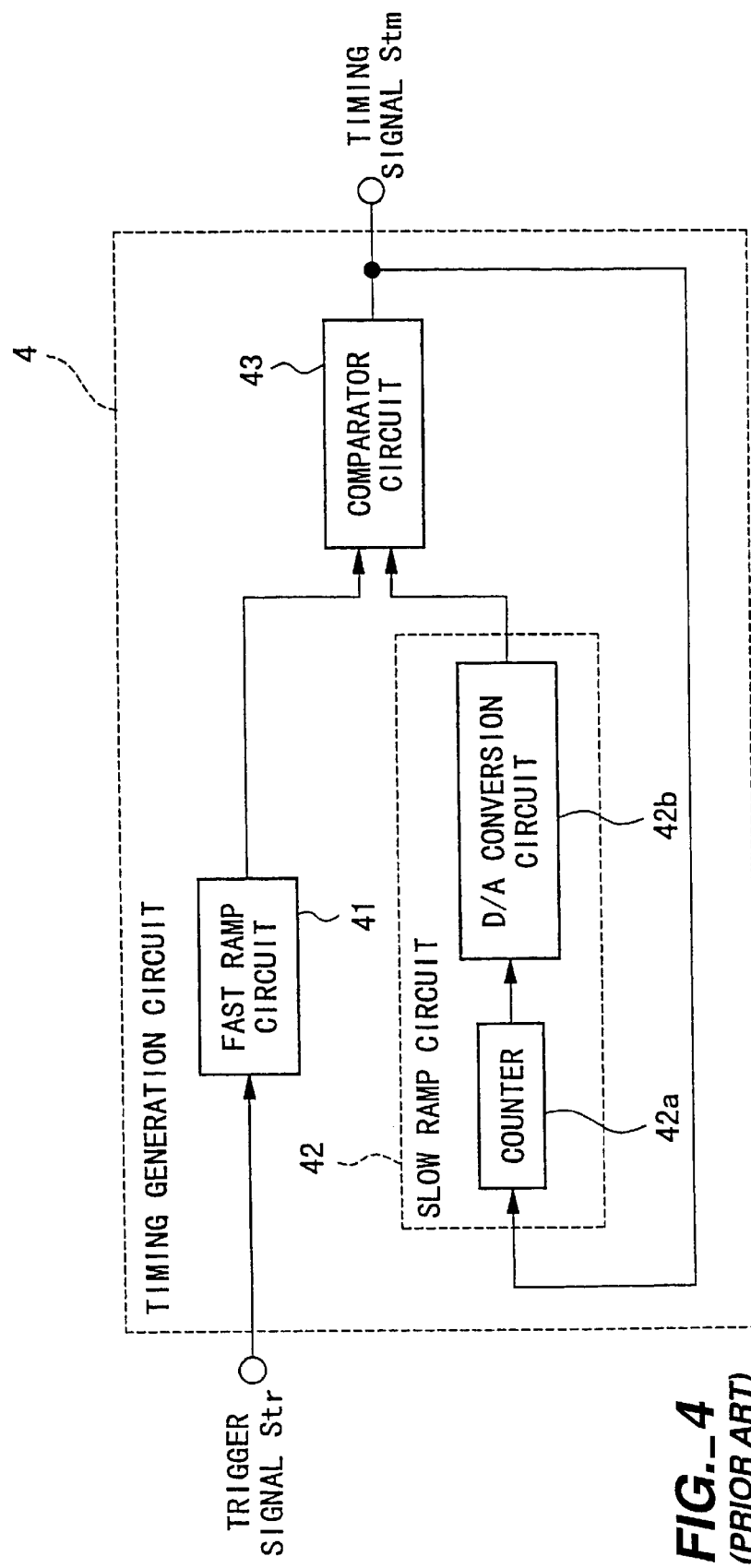
FIG._4 (PRIOR ART)

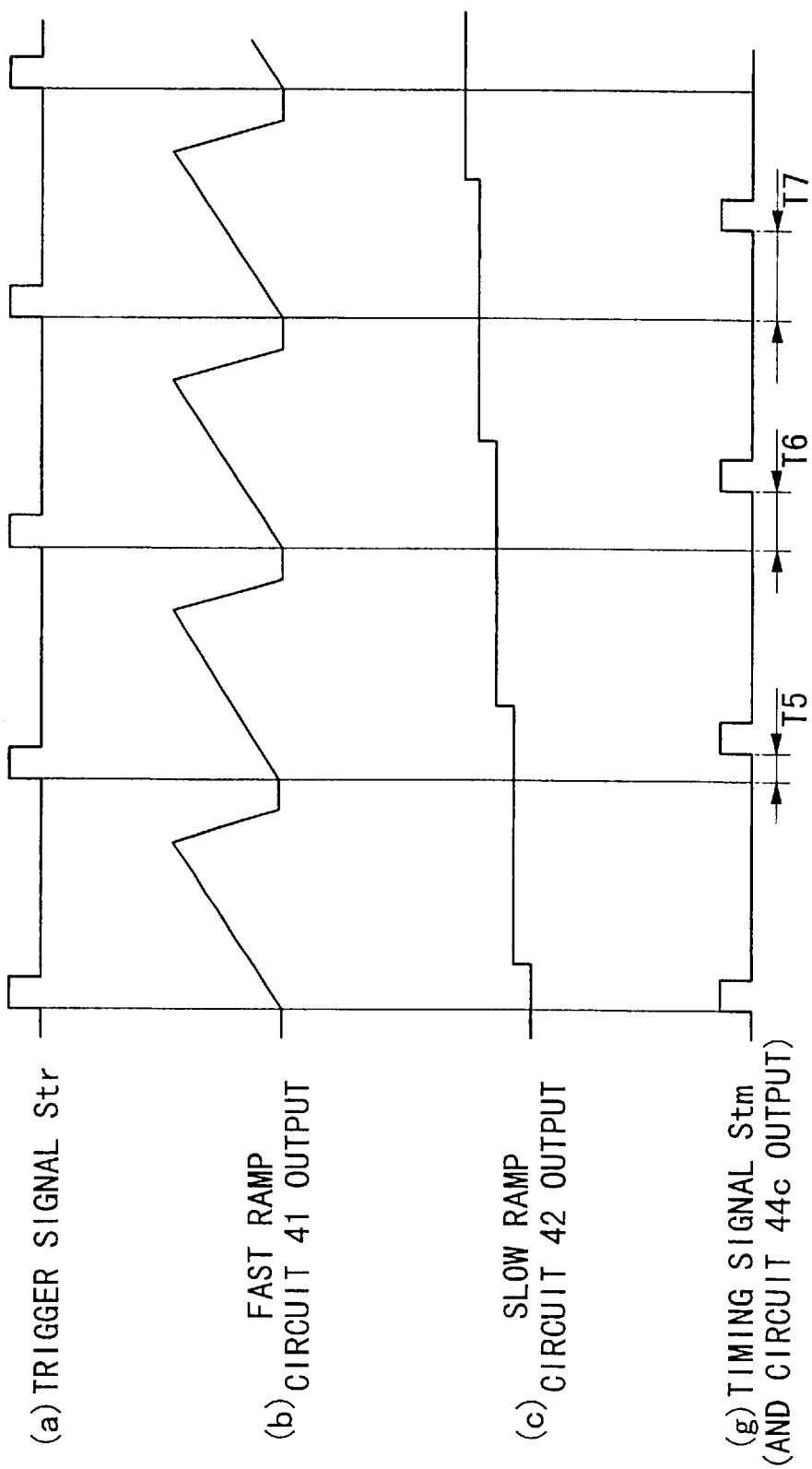

US 6,288,529 B1

TIMING GENERATION CIRCUIT FOR AN ELECTRO-OPTIC OSCILLOSCOPE

BACKGROUND OF THE INVENTION

1. Field of the Invention

The present invention relates to an electro-optic sampling oscilloscope that carries out measurement of a measured signal by using a optical pulse generated based on a timing signal from a timing generation circuit, and in particular to an electro-optic sampling oscilloscope designed to improve the timing generation circuit that generates the timing signal.

This application is based on Japanese Patent Application, No. Hei 10-155046 filed in Japan, the content of which is incorporated herein by reference.

2. Description of the Related Art

It is possible to couple an electrical field generated by a measured signal with an electro-optic crystal, input a laser light into this electro-optic crystal, and observe the waveform of the measured signal by the state of the polarization of the laser light. The electro-optic sampling oscilloscope (hereinbelow, referred to as an EOS oscilloscope) exploits this phenomenon by using an electro-optic probe that can pulse the laser light, and observe with an extremely high time resolution when sampling the measured signal.

When this electro-optic sampling oscilloscope (hereinbelow, referred to as an "EOS oscilloscope") is compared to a conventional sampling oscilloscope that uses an electrical probe, the following characteristics have received much attention:

1. It is easy to observe the signal because a ground wire is unnecessary.

2. Because the metal pins at the end of the electro-optic probe are insulated from the circuit system, it is possible to realize high input impedance, and as a result of this, there is almost no degradation of the state of the measured point.

3. By using an optical pulse, broadband measurement up to the GHz order is possible.

Next, the structure of an EOS oscilloscope will be explained referring to FIG. 3. The EOS oscilloscope is structured from an EOS oscilloscope main body 1 and an electro-optic probe 2. In the main body 1 of the EOS oscilloscope, the trigger circuit 3 receives a signal from the outside, and outputs a trigger signal that marks the beginning of measurement of a measured signal. The timing generation circuit 4 generates the timing of an optical pulse and the timing for A/D conversion, and the optical pulse generation circuit 5 generates an optical pulse based on the timing signal from the timing generation circuit 4. The optical pulse from the optical pulse generation circuit 5 is supplied to the electro-optic probe 2, and is subject to a change in polarization by an electro-optic element. The polarization of the polarized optical pulse is detected in the electro-optic probe 2, and it is converted into an electric signal. This signal is input into on the EOS oscilloscope main body 1, amplification and A/D conversion of the signal are carried out by the A/D conversion circuit 6, processing of the signal that has become the object of measurement for display, etc., is carried out by the processing circuit 7, and it is displayed on the display 8.

FIG. 4 is a block diagram showing an example of the conventional structure of the timing generation circuit 4. In FIG. 4, reference numeral 41 is a fast ramp circuit wherein the trigger signal Str is used as a trigger, and the amplified ramp waveforms are output sequentially. Reference numeral 42 is a slow ramp circuit comprising a counter 42a that increments the input signals and a D/A conversion circuit that D/A converts and outputs the count value of this counter 42a. Reference numeral 43 is a comparator circuit that compares the output of the fast ramp circuit 41 and the output of the slow ramp circuit 42, and outputs the timing signal Stm when they agree. This timing signal Stm becomes the output signal of the timing generation circuit 4. In addition, the timing signal Stm is input into the counter 42a.

Next, the operation of the timing generation circuit 4 shown in if FIG. 4 will be explained referring to FIG. 5. First, the fast ramp circuit 41 outputs a ramp waveform when the trigger signal Str is input (refer to FIG. 5(b)). At the same time, in the slow ramp circuit 42, when the output of the comparator circuit 43 is input, the counter 42a is incremented by 1, and this count value is made into an analogue value by the D/A conversion circuit 42b, and output. Thereby, each time the output of the comparator circuit 43 is input, a step-shaped waveform is generated (refer to FIG. 5(c)). The comparator circuit 43 compares the output of the fast ramp circuit 41 and the output of the slow ramp circuit 42, and after the trigger signal Str is input and rises to the point they agree the first time, outputs a pulse having a pulse width of a specified time (refer to FIG. 5(d)). This becomes the timing signal Stm.

In its initial state, because the output of the fast ramp circuit 41 and the output of the slow ramp circuit 42 are zero, the rise of the timing signal Stm is almost simultaneous with the rise of the trigger signal Str. Subsequently, because the output of the slow ramp circuit 42 becomes sequentially larger each time the timing signal Stm is output from the comparator circuit 43, the time at which the output of the fast ramp circuit 41 and the output of the slow ramp circuit 42 agree is delayed by only time T5 from the rise of the trigger signal Str. Similarly, each time the trigger signal Str is input, the rise is delayed as shown by T6 and T7. By this operation, timing for the sampling of a measured signal is obtained by changing the time elapsed from the trigger signal Str.

In this connection, in the EOS oscilloscope shown in FIG. 3 and FIG. 4, since the output of the slow ramp circuit 42 is obtained by a D/A conversion circuit 42b, during the operation of the D/A conversion the output of the slow ramp circuit 42 becomes unstable (the section shown by reference number S1 in FIG. 2(c)), and as a result the output of the comparator circuit 43 also becomes unstable (the section shown by reference number S2 in FIG. 2(d)). In addition, because the output of the fast ramp circuit 41 is a ramp wave, a certain period of time after becoming the maximum value, the operation for returning to the minimum value is repeated. Therefore, at the point in time of returning to the minimum value from the maximum value, an unnecessary signal (the section shown by reference number S3 in FIG. 2(d)) is output form the comparator circuit 43 because there is a timing that agrees with the output of the slow ramp circuit 42. Because the output of the comparator circuit 43 is the timing signal Stm, when unstable signals and unnecessary signals are output, there is the problem that accurate sampling cannot be carried out.

SUMMARY OF THE INVENTION

Therefore, it is an object of the present invention to provide an EOS oscilloscope that can prevent the output of an unstable output value from the comparator circuit, and can improve the precision of the timing signal.

According to the present invention, this objective can be attained by an electro-optical sampling oscilloscope apparatus that carries out measurement of measured signal by using an optical pulse generated based on a timing signal generated from a timing generation circuit synchronous with a trigger signal, providing the timing generation circuit comprising a fast ramp circuit that outputs a ramp waveform using said trigger signal as a trigger; a slow ramp circuit that increases stepwise and sequentially the output value according to said timing signal; a comparator circuit that compares the output of said fast ramp circuit and the output of said slow ramp circuit and outputs the results of this comparison; and a gate circuit that limits the output of said comparator circuit by closing a gate only when the output of said comparator circuit is unstable based on the input trigger signal and timing signal.

In addition, the present invention provides the advantages that the precision of the timing signal is improved because unnecessary timing signals are not output by receiving an output of the comparator circuit at a gate circuit, and closing the gate during the time that the output of the fast ramp circuit returns from a maximum value to a minimum value and during the time that the D/A conversion operation of the D/A conversion circuit that becomes the output of the slow ramp circuit.

BRIEF DESCRIPTION OF THE DRAWINGS

FIG. 1 is a block diagram showing the structure of an embodiment of the present invention.

FIG. 2 is a timing diagram of the operation of the slow ramp circuit 42 in the embodiment shown in FIG. 1.

FIG. 3 is a block diagram showing the structure of an EOS oscilloscope.

FIG. 4 is a block diagram showing the circuit structure of a conventional example of a timing generation circuit in the EOS oscilloscope.

FIG. 5 is a timing diagram shown the operation that generates the timing signal in a conventional example shown in FIG. 4.

DESCRIPTION OF PREFERRED EMBODIMENTS

The following embodiment does not limit the invention according to the claims. In addition, in order to attain the object, the combination of all the characteristics explained in the embodiment are not always necessary.

Below, an EOS oscilloscope according to an embodiment of the present invention is explained referring to the figures. First, the structure of the EOS oscilloscope is explained referring to FIG. 3. As described above, the EOS oscilloscope is structured from an EOS oscilloscope main body 1 and an electro-optic probe 2. In the main body 1 of the EOS oscilloscope, the trigger circuit 3 receives a signal from the outside, and outputs the trigger signal that marks the beginning of the measurement of the measured signal. The timing generation circuit 4 generates the generation timing of the optical pulse and the timing for an A/D conversion, and the optical pulse generation circuit 5 carries out the generation of the optical pulse based on the timing signal from the timing generation circuit 4.

The optical pulse form the optical pulse generation circuit 5 is supplied to the electro-optic probe 2, and is subject to a change in polarization by an electro-optic element. The polarization of this polarized optical pulse is detected in the electro-optic probe 2, and converted to an electrical signal. This signal is input into the EOS oscilloscope main body 1, amplification of the signal and A/D conversion is carried out by the A/D conversion circuit 6, processing is carried out on the signal which is the object of measurement for displaying, etc., by the processing circuit 7, and it is displayed on a display 8. The present invention improves the timing generation circuit 4.

Next, the timing generation circuit 4 in the EOS oscilloscope according to the embodiment of the present invention is explained referring to FIG. 1. In this figure, parts identical to the conventional circuit shown in FIG. 4 have the same reference number, and their explanation is omitted. The timing generation circuit shown in this figure differs from the conventional circuit in that a gate circuit 44 is provided.

This gate circuit 44 is a circuit that limits the output of the timing signal Stm by opening and closing a gate using the trigger signal Str and output of the AND circuit 44c as a trigger. The gate circuit 44 comprises a timer 44a that inputs the trigger signal Str and the output of the AND circuit 44c, measures a specific time from the rise of the various input signals, and takes the value "H" (high) only during that time; a NOT circuit 44b that inverts and outputs the output of the timer 44a; and an AND circuit 44c that outputs the logical product of the output of the NOT circuit 44b and the comparator circuit 43. The output of the AND circuit 44c becomes the timing signal Stm.

Next, the operation of the timing generation circuit 4 shown in FIG. 1 will be explained referring to FIG. 2. The waveforms showing the slow ramp circuit output in FIG. 2(c) and the comparator circuit output in FIG. 2(d) are shown having an exaggerated output fluctuation in order to simplify understanding of the operation.

First, when the trigger signal Str is output to the fast ramp circuit 41, the fast ramp circuit 41 outputs the ramp waveform. This ramp waveform acquires its maximum value after time T3 from the rise of the trigger signal Str, and from this point become a waveform having a minimum value after time T4 (refer to FIG. 2(b)).

Meanwhile, the slow ramp circuit 42 outputs a step-shaped waveform having an output value that increases each time the timing signal Stm is output. This waveform is the value of the count value of the counter 42a that has been D/A converted and output, and during the operation of the D/A conversion, becomes an unstable output (refer to reference numeral S1 of FIG. 2(c)).

The comparator circuit 43 compares the output of the fast ramp circuit 41 and the output of the slow ramp circuit 42, and takes the value "H" (high) when they agree. The unstable output of the slow ramp circuit 42 is input, and as a result the comparator circuit 43 also has an unstable output fluctuation. In addition, because the output value of the fast ramp circuit 41 intersects the output of the slow ramp circuit 42 when the output of the fast ramp circuit 41 returns to the minimum value, the output of the comparator circuit 43 becomes unstable (refer to FIG. 2(d)). However, during the time that this unstable output fluctuation is generated, the D/A conversion is in operation and the output of the fast ramp circuit 41 returns to a minimum value. Therefore, the time during which this output is unstable is determined by the time of the D/A conversion of the D/A conversion circuit 42b and the output waveform of the fast ramp circuit 41. If this time is measured by a timer, the gate is closed, and the output value of the comparator circuit 43 is limited, then it is possible to generate a correct timing signal.

Next, the operation in which the timer 44a closes the gate will be explained. The timer 44a rises at a time T1 after the rise of the timing signal Stm, and from this point, a signal that rises after time T2, during which the output of the D/A conversion circuit is unstable, is output. That is, when the output of the slow ramp circuit 42 is not stable (the section shown by the reference numeral S1 in FIG. 2(c)), a signal with the value "H" (high) is output (refer to reference number S4 in FIG. 2(e)).

Furthermore, the timer 44a outputs a signal that rises after the time T3 from the rise of the trigger signal until the ramp waveform of the fast ramp circuit becomes a maximum value (refer to FIG. 2(b)) and from this point falls after time T4, until the ramp waveform of the fast ramp circuit 41 becomes a minimum value. That is, in the case that the output of the fast ramp circuit 41 returns to a minimum value from a maximum value, when it agrees with the output of the slow ramp circuit 42 and an unnecessary value is output from the comparator circuit 43 (the section indicated by reference number S3 if FIG. 2(d)), a signal taking the value "H" (high) is output (refer to reference number S5 in FIG. 2(e)).

Moreover, the output of the timer 44a comprises a signal (reference number S4 is FIG. 2(e)) taking the value "H" (high) when the output of the slow ramp circuit 42 is unstable and a signal (reference number S5 in FIG. 2(e)) taking the value "H" (high) when an unnecessary output value is output from the comparator, each generated by the timer, and the their logical sum can be taken.

The time of the rise and fall of the output of the timer 44a is determined at times T1, T2, T3, and T4, but these can also be arbitrarily set to suit the output waveform of the fast ramp circuit 41 and the D/A converter used by the slow ramp circuit 42.

Next, the NOT circuit 44b outputs a signal that inverts the output of the timer 44a. That is, it outputs a signal that takes the value "L" (low) only when an unnecessary output value is output from the comparator circuit 43 (refer to FIG. 2(f)).

Next, the AND circuit 44c can output a timing signal Stm only when the output of the fast ramp circuit 42 and the output of the slow ramp circuit 42 agree by outputting the logical product of the output of the NOT circuit 44b and the output of the comparator circuit 43 (refer to FIG. 2(g)).

In this manner, at the next stage of the comparator circuit 43, a gate circuit 44 is provided, and when an unnecessary output value is output from the comparator circuit 43, a correct timing signal Stm can be obtained because the gate has been closed.

What is claimed is:

1. A timing generation circuit for an electro-optical sampling oscilloscope apparatus that carries out measurement of a measured signal by using an optical pulse generated based on a timing signal generated from the timing generation circuit synchronous with a trigger signal, providing a timing generation circuit comprising:

a fast ramp circuit that outputs a ramp waveform using said trigger signal as a trigger;

a slow ramp circuit that has a D/A conversion circuit that outputs an output value increased stepwise and sequentially by D/A converting a count value of a counter into which said timing signal is input;

a comparator circuit that compares the out put of said fast ramp circuit and the output of said slow ramp circuit and outputs the results of this comparison; and a gate circuit that limits the output of said comparator circuit by closing a gate during the D/A conversion time produced by the operation of said D/A conversion circuit after the rising time of said input timing signal and during the time in which the output of said fast ramp circuit falls from a maximum value to a minimum value after the rise time of said input trigger signal.

2. A timing generation circuit for an electro-optical sampling oscilloscope according to claim 1, wherein said gate circuit comprises:

a timer that measures a first time interval from the input of said trigger signal to the output of said fast ramp circuit reaching the maximum value, and a second time interval during which the output of said fast ramp circuit falls from the maximum value to the minimum value and then measures a third time interval starting from the input of said timing signal and lasting up to the time that the D/A conversion circuit begins operation, and a fourth time interval during which the D/A conversion circuit is operating and the D/A conversion is taking place, and outputs a signal to close the gate during said second time interval and said fourth time interval; and an AND circuit that outputs the logical product of the output of said timer and the output of said comparator circuit.

* * * * *

UNITED STATES PATENT AND TRADEMARK OFFICE
CERTIFICATE OF CORRECTION

PATENT NO. : 6,288,529 B1
DATED : September 11, 2001
INVENTOR(S) : Takeuchi et al.

Page 1 of 1

It is certified that error appears in the above-identified patent and that said Letters Patent is hereby corrected as shown below:

<u>Title page,</u>
The priority information is as follows: Japan 10-155046 dated June 3, 1998.

Signed and Sealed this

Twenty-sixth Day of March, 2002

Attest:

JAMES E. ROGAN
*Attesting Officer*     *Director of the United States Patent and Trademark Office*